(12) United States Patent
Sun et al.

(10) Patent No.: US 10,992,277 B1
(45) Date of Patent: Apr. 27, 2021

(54) VARIABLE GAIN AMPLIFIER WITH EMBEDDED EQUALIZATION FOR UNIFORM TUNING

(71) Applicant: QUALCOMM Incorporated, San Diego, CA (US)

(72) Inventors: Li Sun, Irvine, CA (US); Dong Ren, San Diego, CA (US); Hao Liu, San Diego, CA (US); Sudheer Chowdary Gali, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/785,464

(22) Filed: Feb. 7, 2020

(30) Foreign Application Priority Data

Dec. 6, 2019 (IN) .............................. 201921050528

(51) Int. Cl.
*H03F 3/19* (2006.01)
*H03G 3/30* (2006.01)
*H03G 5/16* (2006.01)
*H04L 25/03* (2006.01)
*H03F 3/45* (2006.01)

(52) U.S. Cl.
CPC ............... *H03G 5/165* (2013.01); *H03F 3/19* (2013.01); *H03G 3/3036* (2013.01); *H04L 25/03057* (2013.01); *H03G 2201/103* (2013.01)

(58) Field of Classification Search
CPC ................. H03G 5/165; H03G 3/3036; H03G 2201/103; H03F 3/19; H04L 25/03057
USPC .......................................... 330/252–261, 283
See application file for complete search history.

(56) References Cited

U.S. PATENT DOCUMENTS

| | | | |
|---|---|---|---|
| 7,598,811 B2 * | 10/2009 | Cao ..................... | H03F 3/45183 330/254 |
| 7,956,687 B2 * | 6/2011 | Vakilian .............. | H03F 3/45197 330/254 |
| 8,964,825 B2 * | 2/2015 | Beukema ............ | H04L 25/0296 375/232 |
| 10,075,141 B1 * | 9/2018 | Nagulapalli ............. | H03G 5/28 |

\* cited by examiner

*Primary Examiner* — Hieu P Nguyen
(74) *Attorney, Agent, or Firm* — Loza & Loza, LLP

(57) ABSTRACT

Certain aspects are directed to an amplifier. The amplifier generally includes a first transistor having a gate coupled to an input node of the amplifier, a source degeneration circuit, and a second transistor coupled between the source degeneration circuit and a source of the first transistor, a gate of the second transistor being configured to receive a gain control signal from a controller.

28 Claims, 8 Drawing Sheets

VARIABLE GAIN AMPLIFIER WITH EMBEDDED EQUALIZATION FOR UNIFORM TUNING

CROSS REFERENCE TO RELATED APPLICATION

This application claims priority to Indian Patent Application, No. 201921050528, filed on Dec. 6, 2019, which is incorporated herein by reference.

FIELD OF THE DISCLOSURE

The present disclosure generally relates to an amplification and equalization circuit and, more particularly, to circuitry for tuning of the amplification and equalization circuit.

DESCRIPTION OF RELATED ART

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high speed bus interface for communication of signals between hardware components. For example, the high speed bus interface may be implemented using a Peripheral Component Interconnect Express (PCIe) bus. High frequency signals being communicated using the bus interface may experience attenuation. Therefore, an amplifier and equalizer at the receiver may be used to amplify and equalize a signal received via the bus interface for processing.

SUMMARY

Certain aspects are directed to an amplifier. The amplifier generally includes a first transistor having a gate coupled to a first input node of the amplifier, a first source degeneration circuit, and a second transistor coupled between the first source degeneration circuit and a source of the first transistor, a gate of the second transistor being configured to receive a gain control signal from a controller.

Certain aspects are directed to an input/output (I/O) interface (e.g., an analog front-end) comprising the amplifier described above.

Certain aspects are directed to a method for signal amplification. The method generally includes amplifying an input signal via a first transistor of an amplifier, adjusting a gain associated with the amplification of the input signal via a gain control signal, and selectively coupling a source degeneration circuit to a source of the first transistor based on the gain control signal.

Certain aspects are directed to an apparatus for signal amplification. The apparatus generally includes means for amplifying an input signal, means for adjusting a gain associated with the means for amplifying of the input signal via a gain control signal, and means for selectively coupling a source degeneration circuit to the means for amplifying based on the gain control signal.

Other aspects, advantages, and features of the present disclosure will become apparent after review of the entire application, including the following sections: Brief Description of the Drawings, Detailed Description, and the Claims.

DETAILED DESCRIPTION

Figure 1:
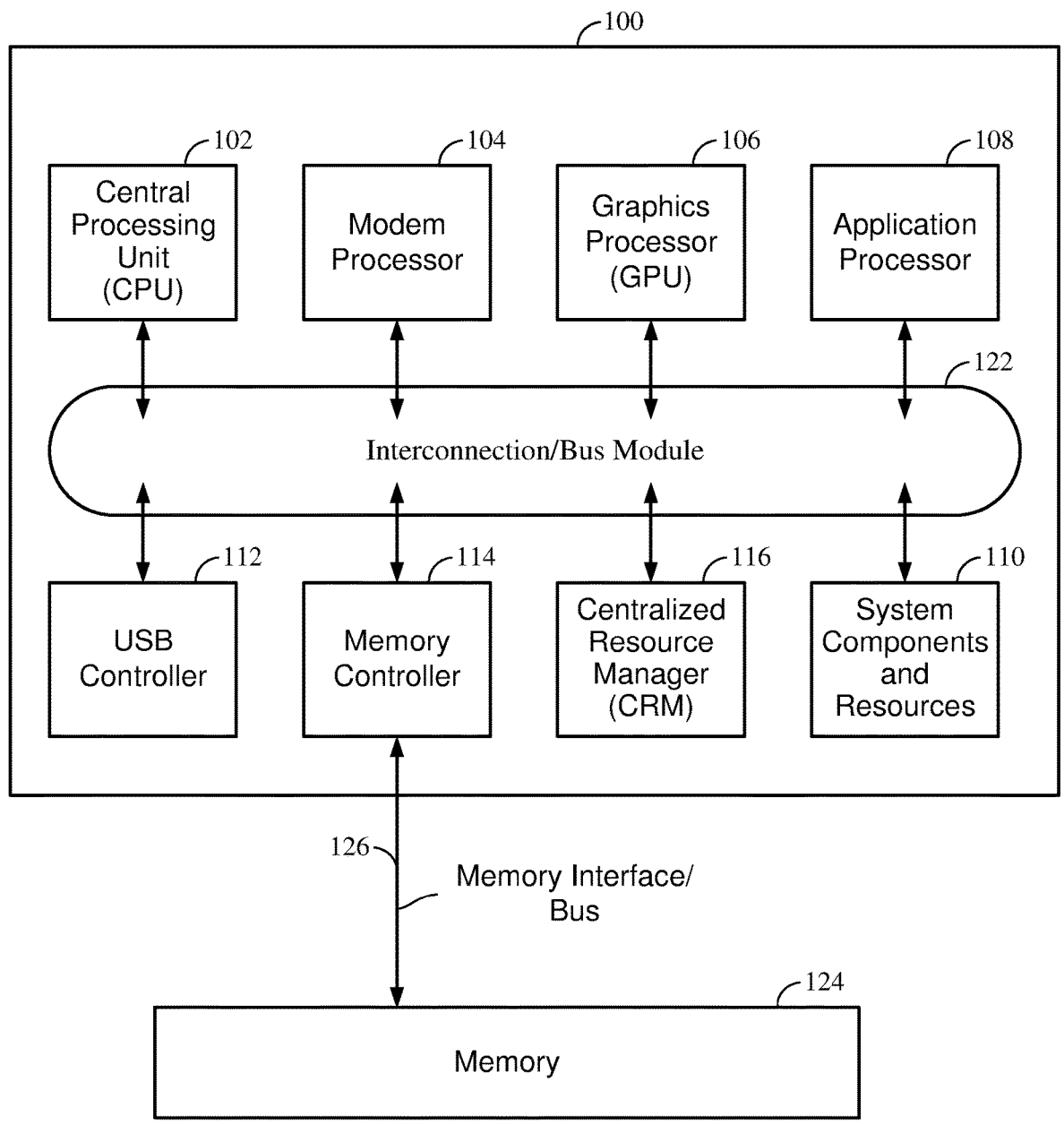
FIG. 1 illustrates a block diagram of an exemplary implementation of a system-on-a-chip (SOC), in accordance with certain aspects of the present disclosure.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Example SoC

FIG. 1 illustrates example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via a memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Example Amplification System

Due to the high cost of modern semiconductor processes and ubiquitous specifications of bandwidth extension, it may be desirable to extend single input/output (I/O) data rate over 20 Gbps. A front-end amplifier may be used as a first stage of a data receiver (e.g., from a Peripheral Component Interconnect Express (PCIe) bus), which may perform both continuous-time linear equalization (CTLE) and gain control. A data channel (e.g., of a PCIe bus) may attenuate a signal at higher frequencies more than lower frequencies. CTLE refers to techniques for boosting the higher frequency components of the signal at the receiver to bring all frequency components of the signal to a similar amplitude, improving jitter and eye-diagram performance.

Performing the two functions of CTLE and gain control within one stage of an amplifier may be preferred due to design complexity and noise contribution of multi-stage amplifications systems. However, having uniform tunability may be difficult to implement in a single amplification stage. Certain aspects of the present disclosure are directed to an amplifier having a compensation network to balance (or at least an adjustment network to alter) both CTLE and gain tuning functions of the amplifier, as described in more detail herein.

Figure 2:
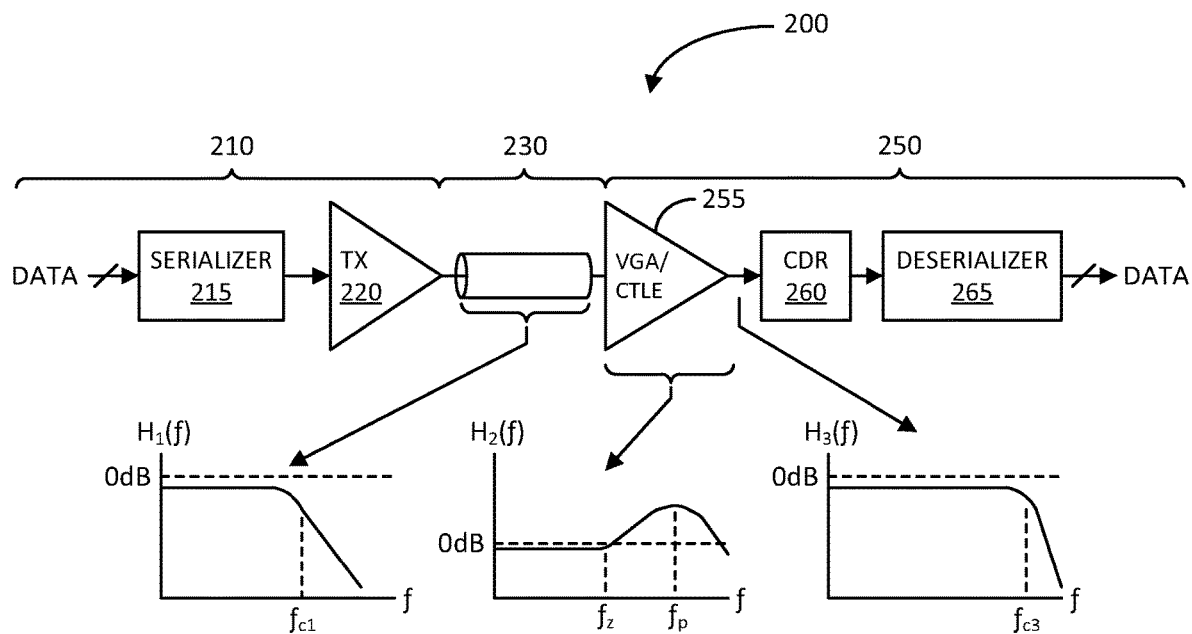
FIG. 2 illustrates a block diagram of an exemplary data communication system, in accordance with certain aspects of the present disclosure.

FIG. 2 illustrates a block diagram of an exemplary data communication system 200, in accordance with certain aspects of the present disclosure. The data communication system 200 includes a transmitter 210, a data communication channel 230, and a receiver 250. The transmitter 210 may be in a first device that is transmitting a data signal to a second device. The data communication channel 230 is the transmission medium through which the data signal propagates from the first device to the second device. The receiver 250 may be in the second device for receiving and processing the data signal.

More specifically, the transmitter 210 includes a serializer 215 configured to convert parallel data into serial data. The transmitter 210 further includes a transmit driver 220 configured to generate a data signal based on the serial data for transmission to the receiver 250 via the data communication channel 230.

The data communication channel 230 may be any type of transmission medium by which a data signal propagates from the transmitter 210 to the receiver 250. Examples of the data communication channel 230 includes one or more metallization traces (which may include one or more vias) on a printed circuit board (PCB), stripline, microstrip, coaxial cable, twisted pair, etc.

The receiver 250 includes a variable gain amplifier (VGA)/continuous time linear equalizer (CTLE) 255, which may be implemented in a single stage or multiple stages, a clock data recovery circuit (CDR) 260, and a deserializer 265. As discussed in more detail herein, the VGA/CTLE 255 is configured to perform equalization and amplification of the received data signal. The CDR 260 is configured to recover a clock associated with the data signal, and use the clock to recover the serial data from the data signal. The deserializer 265 is configured to convert the serial data back into parallel data.

The data communication channel 230 typically has a frequency response $H_1(f)$ that is similar to a low pass filter. For instance, the frequency response $H_1(f)$ has relatively low losses from direct current (DC) up to a particularly cutoff frequency $f_{c1}$; then the losses increase monotonically above the cutoff frequency $f_{c1}$. The frequency response $H_1(f)$ of the data communication channel 230 limits the data rate at which data may be sent through the channel. For example, the cutoff frequency $f_{c1}$ should be at least to the Nyquist rate of the data signal. If the Nyquist rate of the data signal is above the cutoff frequency $f_{c1}$, the data signal exhibits distortion at the receiver 250, which may be characterized as the eye in a signal eye diagram closing or getting smaller, making it difficult to recover the clock and the data by the CDR 260.

Thus, to increase the data rate at which the data signal may be sent through the data communication cable 230 for successful recovery of the data, the VGA/CTLE 255 performs equalization and amplification to increase the high frequency components of the data signal. For example, the VGA/CTLE 255 may have a frequency response $H_2(f)$ that is substantially flat from DC up to a frequency $f_z$ corresponding to a zero. Then, above the zero frequency $f_z$, the frequency response $H_2(f)$ of the VGA/CTLE 255 increases up to a frequency $f_p$ corresponding to a pole. Above the pole frequency $f_p$, the frequency response $H_2(f)$ of the VGA/CTLE 255 decreases monotonically; although, depending on the particular design for the VGA/CTLE 255, it may have more than one pole.

The VGA/CTLE 255 may be configured to have a frequency response $H_2(f)$ where the pole frequency $f_p$ substantially coincides with the cutoff frequency $f_{c1}$ of the frequency response $H_1(f)$ of the data communication channel 230. As the data communication channel 230 is cascaded with the VGA/CTLE 255, the frequency responses $H_1(f)$ and $H_2(f)$ of the data communication channel 230 and the VGA/CTLE 255 combine at the output of the VGA/CTLE 255 to form a composite frequency response $H_3(f)$. Thus, the high frequency boost at the pole frequency $f_p$ of the VGA/CTLE frequency response $H_2(f)$ compensates for the loss roll off at the cutoff frequency $f_{c1}$ of the channel frequency response $H_1(f)$ to generate the composite frequency response $H_3(f)$ having a cutoff frequency $f_{c3}$ much higher than the cutoff frequency $f_{c1}$ of the channel frequency response $H_1(f)$. Thus, through the use of the VGA/CTLE 255, much higher data rates between the transmitter 210 and receiver 250 may be realized.

Figure 3A:
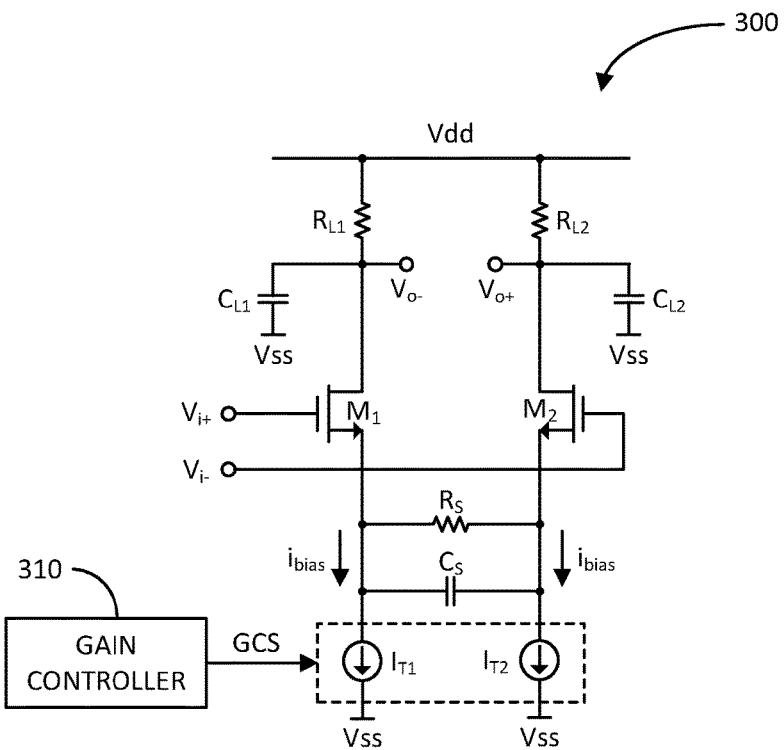
FIG. 3A illustrates an exemplary variable gain amplifier (VGA) with embedded equalization, in accordance with certain aspects of the present disclosure.

FIG. 3A illustrates an example variable gain amplifier (VGA) 300 with embedded equalization, in accordance with certain aspects of the present disclosure. The VGA 300 could also be characterized as a continuous time linear equalizer (CTLE) with embedded gain control.

The VGA 300 includes a first load resistor $R_{L1}$ (generally a resistive device), a first input transistor $M_1$ (e.g., an n-type metal-oxide-semiconductor field effect transistor (NMOS FET), and a first tail current source $I_{T1}$ coupled in series between an upper voltage rail Vdd and a lower voltage rail Vss. The VGA 300 further includes a second load resistor $R_{L2}$ (generally a resistive device), a second input transistor $M_2$ (e.g., an NMOS FET), and a second tail current source $I_{T2}$ coupled in series between the upper voltage rail Vdd and the lower voltage rail Vss.

The VGA 300 further includes a source degeneration resistor $R_S$ (generally a resistive device) coupled in parallel with a source degeneration capacitor $C_S$ (generally a capacitive device) between the sources of the input transistors $M_1$ and $M_2$. Additionally, the VGA 300 includes load capacitors $C_{L1}$ and $C_{L2}$ (generally capacitive devices) coupled between the drains of the input transistors $M_1$ and $M_2$ and the lower voltage rail Vss, respectively.

The VGA 300 also includes a gain controller 310 configured to generate a gain control signal (GCS) for controlling the amount of bias current $I_{bias}$ that the tail current sources $I_{T1}$ and $I_{T2}$ sink, respectively. As discussed in more detail below, the gain of the VGA 300 is directly related (in the same direction) to the bias current $I_{bias}$. Thus, the gain controller 310 is configured to control the gain of the VGA 300 by controlling the bias current $I_{bias}$ of the tail current sources $I_{T1}$ and $I_{T2}$ via the gain control signal (GCS).

Figure 3B:
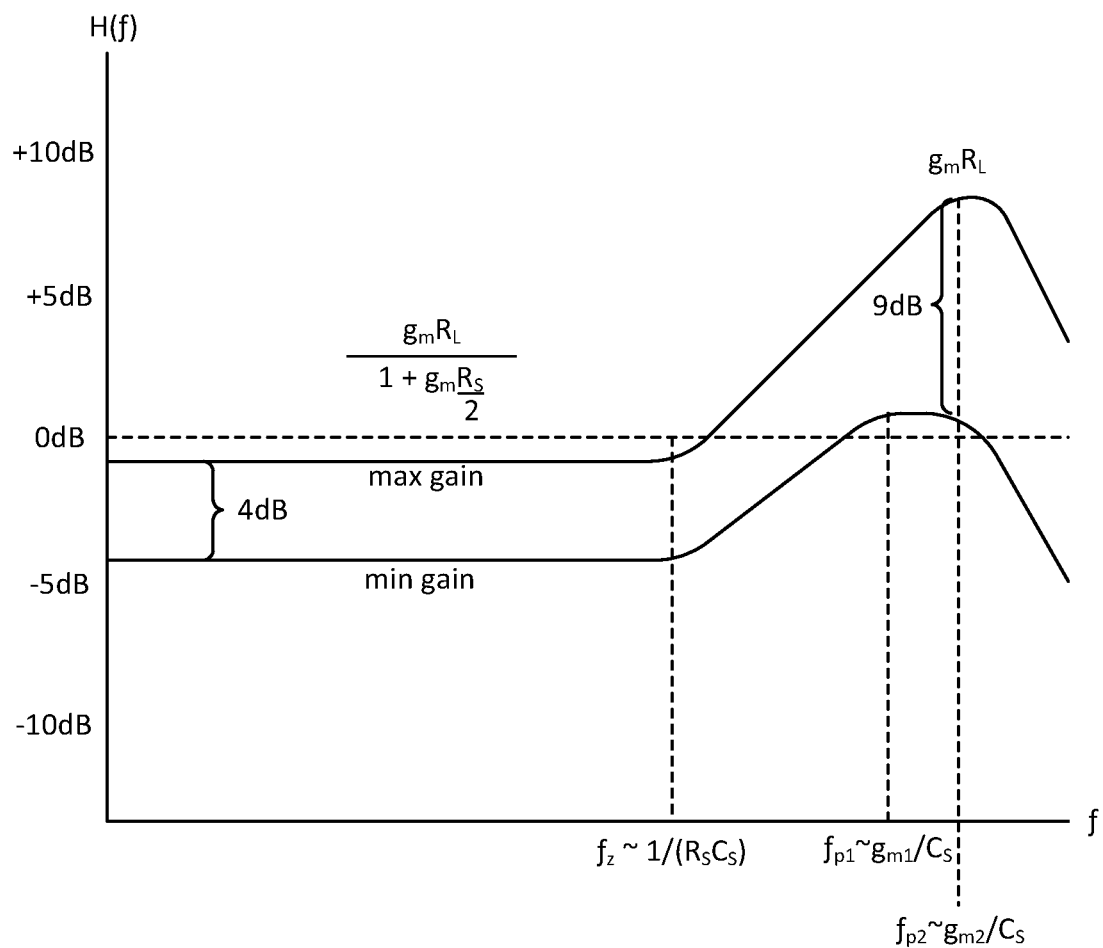
FIG. 3B illustrates a graph of an exemplary frequency response of the VGA of FIG. 3A, in accordance with certain aspects of the present disclosure.

FIG. 3B illustrates a graph of an exemplary frequency response H(f) of the VGA 300, in accordance with certain aspects of the present disclosure. The x- or horizontal axis represents frequency (f), and the y- or vertical axis represents gain H(f).

The gain of the VGA 300 for frequencies at or below a zero frequency $f_z$ may be approximated by the following equation:

$$H(f) \cong \frac{g_m R_L}{1 + g_m \frac{R_S}{2}} \qquad \text{Eq. 1}$$

where $g_m$ is the transconductance gain of the input transistors $M_1$ and $M_2$, $R_L$ is the resistance of the load resistors $R_{L1}$ and $R_{L2}$, and $R_S$ is the resistance of the source degeneration resistor $R_S$. The zero frequency $f_z$ may be approximated by the following equation:

$$f_z = \frac{1}{R_S C_S} \qquad \text{Eq. 2}$$

where $C_S$ is the capacitance of the source degeneration capacitor $C_S$.

The gain of the VGA 300 at the pole frequency $f_p$ may be approximated by the following equation:

$$H(f) \approx g_m R_L \qquad \text{Eq. 3}$$

The pole frequency $f_p$ may be approximated by the following equation:

$$f_p = \frac{g_m}{C_S} \qquad \text{Eq. 4}$$

The transconductance gain $g_m$ of the input transistors $M_1$ and $M_2$ varies directly with the bias current $I_{bias}$ of the tail current sources $I_{T1}$ and $I_{T2}$.

With reference to the graph of FIG. 3B, as the gain controller 310 varies the gain by varying the bias current $I_{bias}$, the gain of the VGA 300 at or below the zero frequency $f_z$ varies in accordance with Eq. 1, and the gain of the VGA 300 for the frequency range between the zero frequency $f_z$ and the pole frequency $f_p$ varies more in accordance with Eq. 3. As the transconductance gain $g_m$ of the VGA 300 is in both the numerator and denominator in Eq. 1, and only in the numerator (or proportional) in Eq. 3, the gain varies less for frequencies below the zero frequency $f_z$ as compared to the gain above the zero frequency $f_z$ with changes in $I_{bias}$. This produces a non-uniform gain variation with frequency, which may be undesirable.

For example, with reference again to the graph of FIG. 3B, the gain of the VGA 300 at or below the zero frequency $f_z$ may have a variation of 4 decibels (dBs) between a minimum gain (corresponding to a minimum $I_{bias}$) and a maximum gain (corresponding to a maximum $I_{bias}$). Whereas, the gain of the VGA 300 at the pole frequency $f_p$ may have a variation of 9 dBs between the minimum and maximum gains. The max and min gain difference increases from 4 dB to 9 dB between the zero frequency $f_z$ and the pole frequency $f_p$.

Moreover, as the pole frequency $f_p$ varies directly with the transconductance gain $g_m$ in accordance with Eq. 4, the pole frequency $f_p$ also varies with gain adjustments via the control of the $I_{bias}$. For example, the pole frequency $f_{p1}$ associated with the minimum gain is approximately $g_{m1}/C_S$, where $g_{m1}$ is the transconductance gain of the input transistors $M_1$ and $M_2$ when the minimum $I_{bias}$ is set. The pole frequency $f_{p2}$ associated with the maximum gain is approximately $g_{m2}/C_S$, where $g_{m2}$ is the transconductance gain of the input transistors $M_1$ and $M_2$ when the maximum $I_{bias}$ is set. Thus, the pole frequency $f_p$ increases with gain increase, which also adds another non-uniformity dimension to the frequency response H(f) of the VGA 300.

Figure 4A:
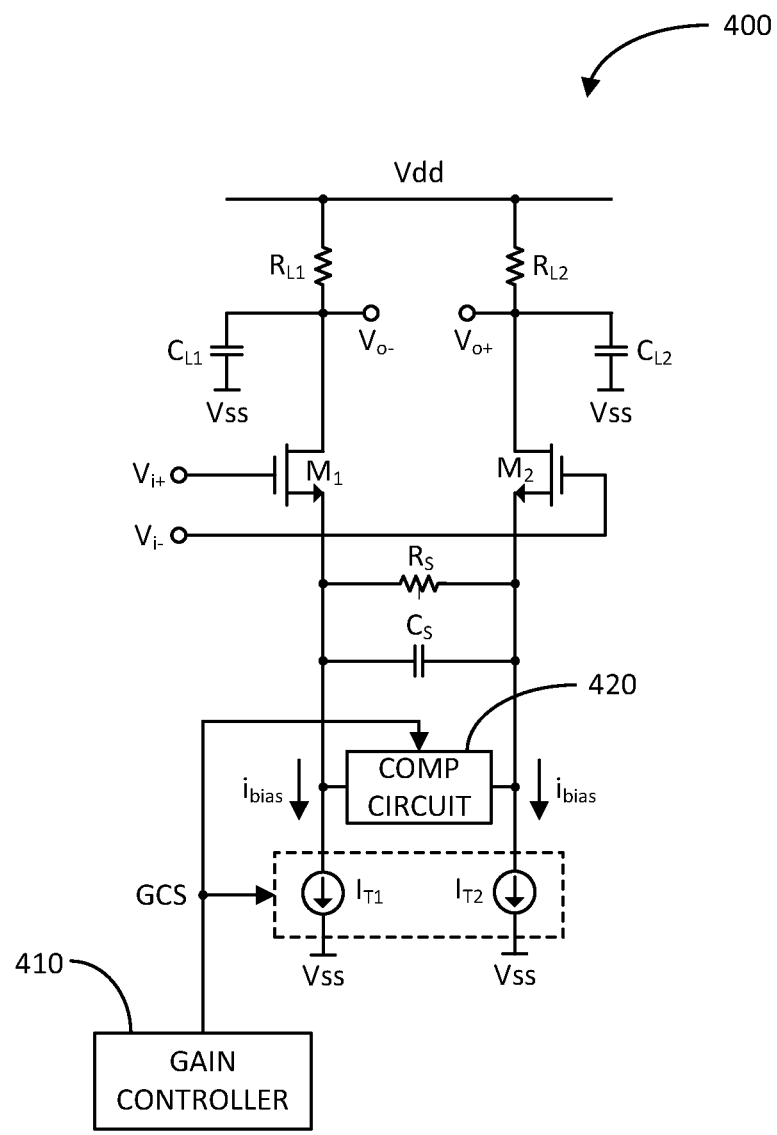
FIG. 4A illustrates a block diagram of an exemplary variable gain amplifier (VGA) with embedded equalization, in accordance with certain aspects of the present disclosure.

FIG. 4A illustrates another exemplary variable gain amplifier (VGA) 400 with embedded equalization, in accordance with certain aspects of the present disclosure. Again, the VGA 300 could also be characterized as a continuous time linear equalizer (CTLE) with embedded gain control. The VGA 400 is similar to VGA 300, and includes many of the same elements as indicated by the same reference terms.

To counter the gain and pole frequency non-uniformity of the frequency response of the VGA 300, the VGA 400 further includes a compensation circuit 420 coupled between the sources of the input transistors $M_1$ and $M_2$. The compensation circuit 420 is responsive to the gain control signal (GCS) generated by a gain controller 410, which also controls the bias current $I_{bias}$ of the tail current sources $I_{T1}$ and $I_{T2}$.

The compensation circuit 420 applies more source degeneration resistance in response to the gain control signal (GCS) increasing the gain of the VGA 400. The source degeneration resistance, being in the denominator of the gain equation, tends to lower the gain to counter the increasing gain in the frequency range between the zero frequency $f_z$ and the pole frequency $f_p$. Thus, compensation circuit 420 is configured to provide a more uniform gain of the amplifier for frequencies between a zero and a pole of a frequency response of the amplifier in response to the gain control signal.

The compensation circuit 420 also applies more source degeneration capacitance in response to the gain control signal (GCS) increasing the gain of the VGA 400. The source degeneration capacitance, being in the denominator of the pole frequency equation, tends to lower the pole frequency to counter the increasing pole frequency with increasing bias current $I_{bias}$. Thus, the compensation circuit 420 is configured to reduce a variation of a pole frequency of a frequency response of the amplifier in response to the gain control signal (CGS) varying a gain of the amplifier.

Figure 4B:
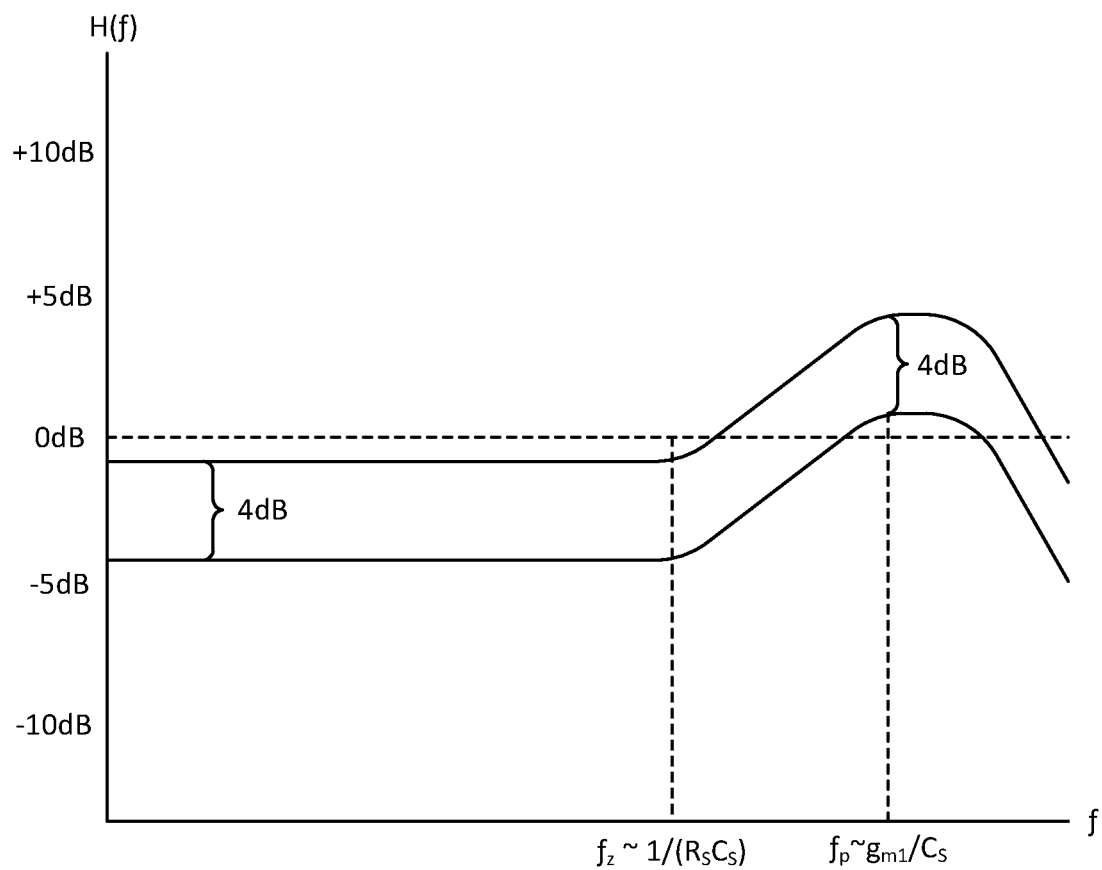
FIG. 4B illustrates a graph of an exemplary frequency response of the VGA of FIG. 4A, in accordance with certain aspects of the present disclosure.

FIG. 4B illustrates a graph of an exemplary frequency response H(f) of the VGA 400, in accordance with certain aspects of the present disclosure. Similarly, the x- or horizontal axis represents frequency (f), and the y- or vertical axis represents gain H(f). As the graph depicts, by providing the compensation circuit 420 responsive to the gain control signal (GCS), and properly configuring the additional source degeneration resistance and capacitance, the difference between the maximum and minimum gain (e.g., 4 dB) over the frequency range up to at least the pole frequency is substantially constant. Also, the pole frequency $f_p$ remains substantially constant with gain variation responsive to the gain control signal (GCS).

Figure 5A:
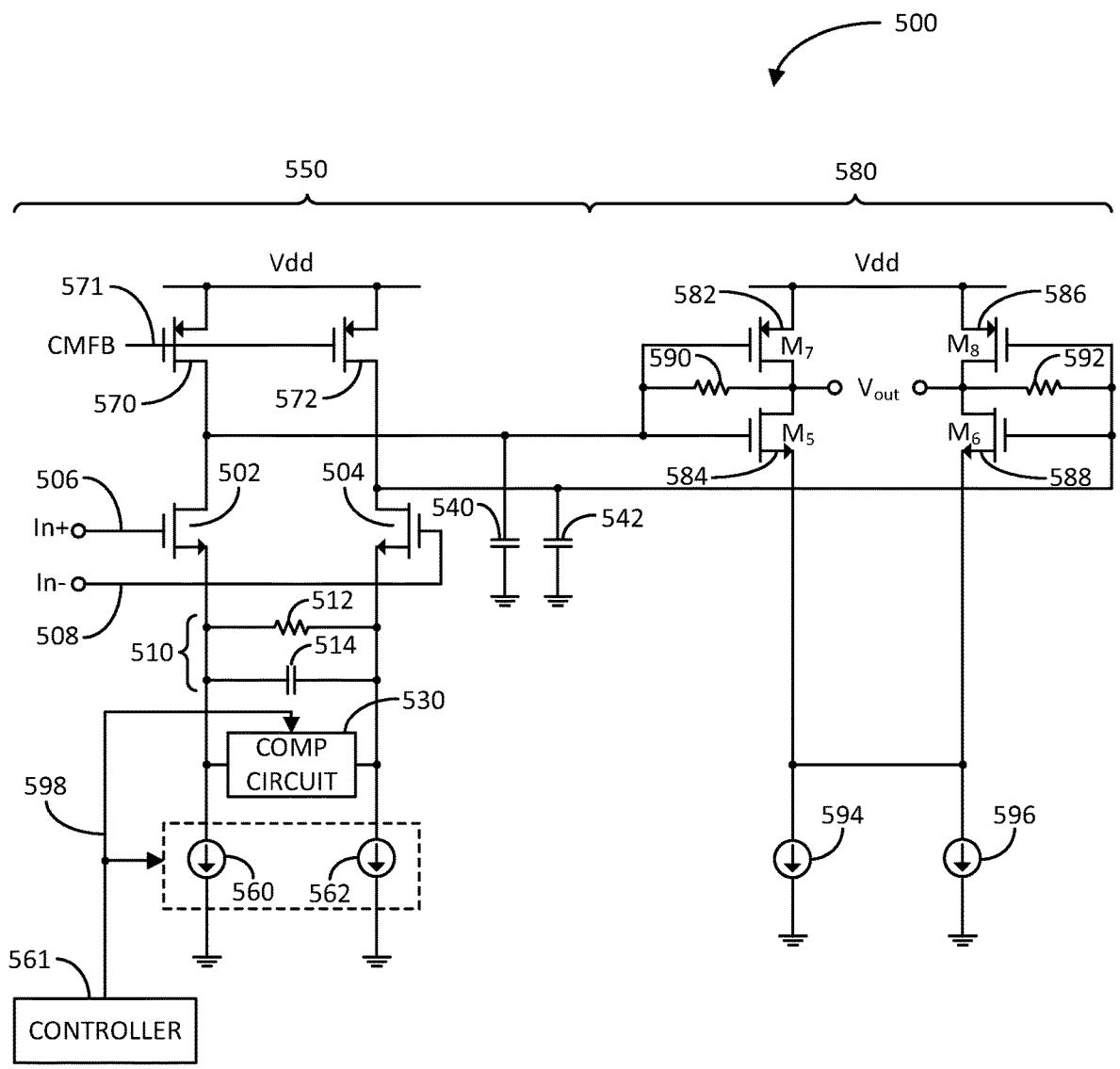
FIGS. 5A and 5B illustrate a schematic diagram of an exemplary amplifier having a compensation circuit, in accordance with certain aspects of the present disclosure.

FIG. 5A illustrates a schematic diagram of an amplifier 500 having a compensation circuit 520, in accordance with certain aspects of the present disclosure.

The amplifier 500 may include an equalization-gain stage including input transistors 502, 504 (e.g., n-type metal-oxide-semiconductor (NMOS) transistors), having gates coupled to respective differential input signals (In+, In−) at input nodes 506, 508 (e.g., differential input pair). As illustrated, a parallel resistor-capacitor (RC) circuit 510 (also referred to as a "source degeneration circuit") may be coupled between sources of the transistors 502, 504 for source degeneration. With the source degeneration circuit, the amplifier 500 implements a higher gain at relatively higher frequencies for CTLE. The RC circuit 510 may include a resistive element 512 coupled in parallel with a capacitive element 514. For example, the impedance of the RC circuit 510 may be adjusted based on the operating bandwidth of a data channel of a bus interface. For instance, the source degeneration by the RC circuit 510 may be adjusted to set a peak gain of the amplifier 500 at the Nyquist frequency of the data channel.

In certain aspects, current sources 560, 562 (also referred to as current source circuits or current sinks) may be coupled to the sources of respective transistors 502, 504 and configured to sink a tail current from the sources of the transistors 502, 504. A controller 561 may control the current sources 560, 562 via a gain control signal 598 to adjust the current of the current sources and thereby the gain associated with the amplifier 500. In certain aspects, the current sources 560, 562 may be adjusted using a digital control signal. For example, each of the current sources 560, 562 may represent multiple current sources that are selectively activated using bits of the digital control signal. In certain aspects, the current sources 560, 562 may be controlled via an analog control signal. As illustrated in FIG.

5A, transistors 570, 572 (e.g., p-type metal-oxide-semiconductor (PMOS) transistors) may be coupled between the voltage rail node Vdd and respective drains of the transistors 502, 504 for common-mode feedback (CMFB). For example, the gates of the transistors 570, 572 may be coupled to a CMFB node 571 providing a CMFB signal.

As illustrated in FIG. 5A, a VGA stage 580 may be coupled to the drains of the transistors 502, 504. The VGA stage 580 may include transistors 582, 584 and a resistive element 590 coupled between gates of the transistors 582, 584 and drains of the transistors 582, 584. The VGA stage 580 may also include transistors 586, 588 and a resistive element 592 coupled between gates of the transistors 586, 588 and drains of the transistors 586, 588. The VGA stage 580 may also include tail current sources 594, 596 configured to sink biasing currents from the sources of the transistors 584, 588, as illustrated. The resistive elements 590, 592 may be tunable, such that the resistances of the resistive elements 590, 592 may be adjusted to control the gain associated with the VGA stage 580. In certain aspects, shunt capacitive elements 540, 542 may be coupled to respective drains of the transistors 502, 504 (i.e., coupled between the drains of the transistors 502, 504 and a reference potential node (e.g., electrical ground) for the amplifier 500, as depicted).

Figure 5B:
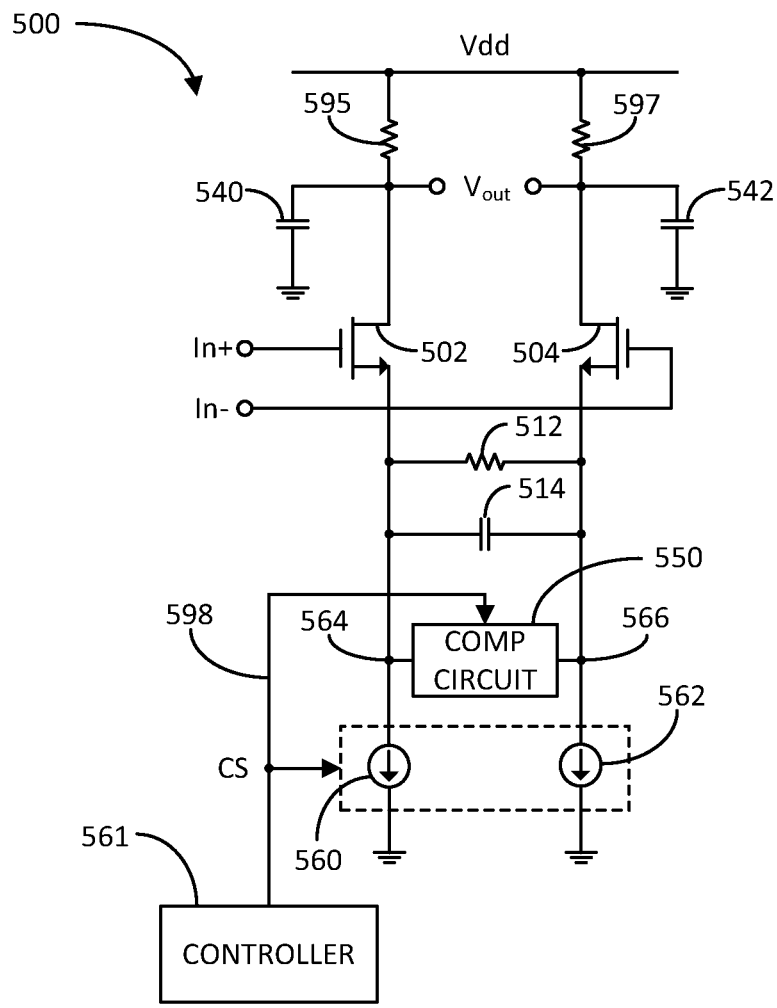

FIG. 5B illustrates another implementation of the amplifier 500. As illustrated in FIG. 5B, resistive elements 595, 597 may be coupled between the voltage rail Vdd and respective drains of the transistors 502, 504. The resistances of the resistive elements 595, 597 may be set to control the gain (e.g., direct-current (DC) gain) associated with the amplifier 500.

In certain aspects of the present disclosure, the compensation circuit 550 may be coupled between nodes 564, 566 at respective sources of the transistors 502, 504. Without the compensation circuit 550, any adjustment of the gain of the amplifier 500 via the gain control signal 598 by the controller 561 may result in an adjustment of the CTLE setting of the amplifier 500. However, once the CTLE of the amplifier 500 is set for a data channel, it is desirable that the CTLE setting be unaffected by adjustments in the gain setting of the amplifier. The compensation circuit 550 is configured to decouple the gain and CTLE control mechanisms of the amplifier 500 such that the gain of the amplifier 500 may be adjusted with little to no impact to the CTLE setting.

Figure 6:
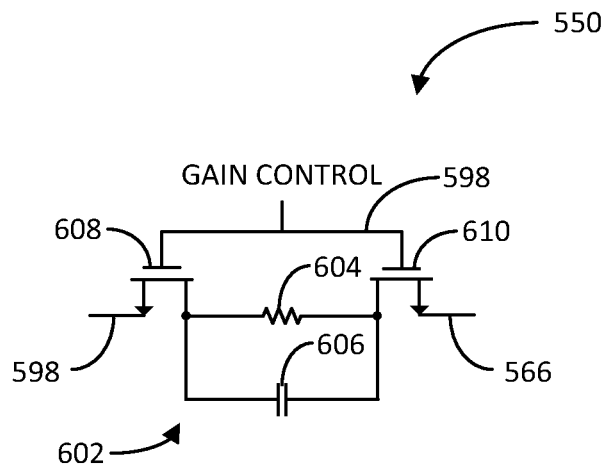
FIG. 6 illustrates an example implementation of a compensation circuit, in accordance with certain aspects of the present disclosure.

FIG. 6 illustrates an example implementation of the compensation circuit 550, in accordance with certain aspects of the present disclosure. As illustrated, the compensation circuit 550 may include a parallel RC circuit 602 (also referred to as a source degeneration circuit) having a resistive element 604 in parallel with a capacitive element 606. A transistor 608 (e.g., an NMOS transistor) may be coupled between node 564 and the RC circuit 602, and a transistor 610 (e.g., an NMOS transistor) may be coupled between node 566 and the RC circuit 602, as illustrated. The gates of the transistors 608, 610 may be coupled to a gain control node providing the gain control signal 598, which may correspond to the gain control signal used to control the current sources 560, 562, as described with respect to FIGS. 5A and 5B. The sources of the transistors 608, 610 may be coupled to the respective nodes 564, 566, and the drains of the transistors 608, 610 may be coupled to the RC circuit 602.

As described herein, the gain control signal 598 may be a digital signal. In this case, the compensation circuit 550 illustrated in FIG. 5 may be one of multiple compensation circuits. The RC circuits of the compensation circuits may be selectively coupled (e.g., using switches, which may be implemented by transistors 608, 610 or other suitable means) between the nodes 564, 566 depending on the digital gain control signal 598. In other words, as the digital gain control signal increases, increasing the gain of the amplifier 500 (e.g., increasing the tail current of amplifier 500 via current sources 560, 562), the quantity of the RC circuits coupled between the nodes 564, 566 may be increased (e.g., by turning on transistors 608, 610 in each of the multiple compensation circuits). In some cases, the gain control signal may be an analog signal used to control the transistors 608, 610. Thus, the amount of source degeneration applied for the amplifier 500 may be adjusted when the gain of the amplifier 500 is adjusted, in an attempt to compensate for the impact that the gain adjustment has on CTLE.

Figure 7:
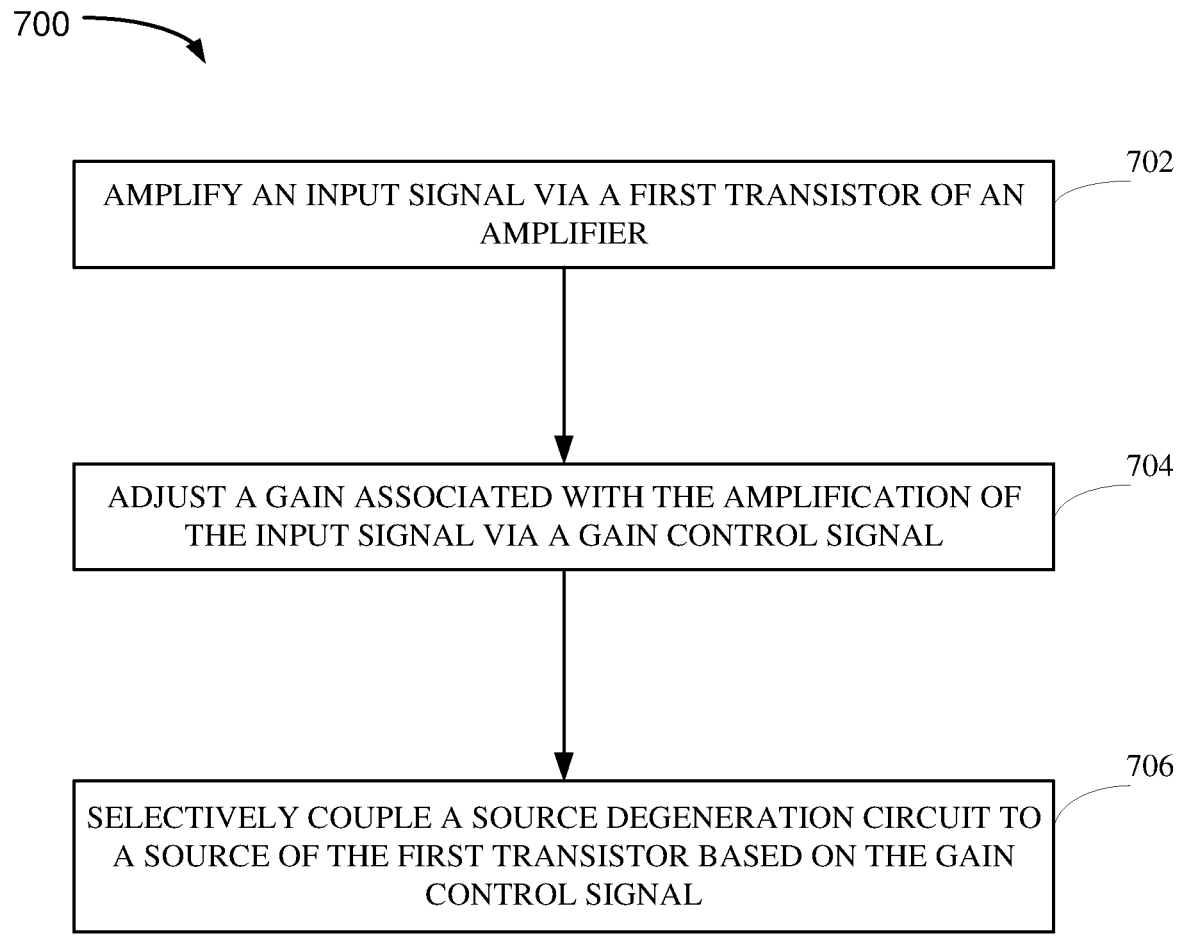
FIG. 7 is a flow diagram illustrating example operations for signal amplification, in accordance with certain aspects of the present disclosure.

FIG. 7 is a flow diagram illustrating example operations 700 for signal amplification, in accordance with certain aspects of the present disclosure. The operations 700 may be performed by an amplifier, such as the amplifier 500 described with respect to FIGS. 5A, 5B, and 6.

The operations 700 begin, at block 702, with the amplifier amplifying an input signal via a first transistor (e.g., transistor 502). At block 704, the amplifier may adjust a gain associated with the amplification of the input signal via a gain control signal (e.g., gain control signal 598). At block 706, the amplifier may selectively couple a source degeneration circuit (e.g., parallel RC circuit 602) to a source of the first transistor based on the gain control signal. The source degeneration circuit may include a resistive element (e.g., resistive element 604) and a capacitive element (e.g., capacitive element 606) coupled in parallel with the resistive element. In certain aspects, the amplifier may adjust the gain at block 704 by sinking a current (e.g., via current source 560) from the source of the first transistor based on the gain control signal.

In certain aspects, the input signal may be a differential input signal being amplified via the first transistor and a second transistor (e.g., transistor 504). In this case, the source degeneration circuit may be selectively coupled between the source of the first transistor and a source of the second transistor, based on the gain control signal. In certain aspects, the amplifier may adjust the gain at block 704 by: (1) sinking a current (e.g., via current source 560) from the source of the first transistor based on the gain control signal and (2) sinking another current (e.g., via current source 562) from the source of the second transistor based on the gain control signal.

In certain aspects, the source degeneration circuit may include a plurality of parallel resistor-capacitor (RC) circuits. In this case, the selectively coupling at block 706 may include selectively coupling each of the plurality of parallel RC circuits to the source of the first transistor based on the gain control signal, the gain control signal being a digital signal.

In certain aspects, the operations 700 may also include performing continuous-time linear equalization (CTLE) by adjusting an impedance coupled to a source of the first transistor (e.g., impedance associated with the source degeneration circuit, such as the parallel RC circuit 510).

The various illustrative circuits described in connection with aspects described herein may be implemented in or with an integrated circuit (IC), such as a processor, a digital signal processor (DSP), an application-specific integrated circuit (ASIC), a field-programmable gate array (FPGA), or other programmable logic device. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering. In certain aspects, means for amplifying may include a transistor, such as the transistor 502 or transistor 504. Means for adjusting may include a current source, such as the current source 560 or current source 562. Means for selectively coupling may include a switch, which may be implemented by a transistor, such as the transistor 608 or transistor 610.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An amplifier comprising:
   a first transistor having a gate coupled to a first input node of the amplifier;
   a first source degeneration circuit;
   a second transistor coupled between the first source degeneration circuit and a source of the first transistor, a gate of the second transistor being configured to receive a gain control signal from a controller; and
   a current source circuit coupled to the source of the first transistor, wherein the current source circuit is configured to receive the gain control signal from the controller for simultaneously adjustment of the current source circuit and the second transistor.

2. The amplifier of claim 1, further comprising:
   a third transistor having a gate coupled to a second input node of the amplifier, the first input node and the second input node forming a differential input pair; and
   a fourth transistor coupled between the first source degeneration circuit and a source of the third transistor, a gate of the fourth transistor being configured to receive the gain control signal from the controller.

3. The amplifier of claim 2, wherein the current source circuit comprises:
   a first current source circuit coupled to the source of the first transistor, wherein the first current source circuit is configured to receive the gain control signal from the controller; and
   a second current source circuit coupled to the source of the second transistor, wherein the second current source circuit is configured to receive the gain control signal from the controller.

4. The amplifier of claim 1, further comprising a second source degeneration circuit coupled to the source of the first transistor.

5. The amplifier of claim 4, wherein an impedance associated with the second source degeneration circuit is set for continuous-time linear equalization (CTLE).

6. The amplifier of claim 1, wherein the first source degeneration circuit comprises:
   a resistive element; and
   a capacitive element coupled in parallel with the resistive element.

7. The amplifier of claim 1, wherein the first source degeneration circuit comprises a plurality of parallel resistor-capacitor (RC) circuits selectively coupled to the source of the first transistor based on the gain control signal, the gain control signal being a digital signal.

8. The amplifier of claim 1, further comprising a resistive element coupled between a voltage rail node and a drain of the first transistor.

9. The amplifier of claim 1, further comprising a third transistor coupled between a voltage rail node and a drain of the first transistor, a gate of the third transistor being coupled to a common-mode feedback node of the amplifier.

10. The amplifier of claim 1, wherein the first transistor comprises an n-type metal-oxide-semiconductor (NMOS) transistor.

11. The amplifier of claim 1, wherein the second transistor comprises an n-type metal-oxide-semiconductor (NMOS) transistor.

12. The amplifier of claim 1, wherein the first source degeneration circuit is configured to provide a more uniform gain of the amplifier for frequencies between a zero and a pole of a frequency response of the amplifier in response to the gain control signal.

13. The amplifier of claim 1, wherein the first source degeneration circuit is configured to apply more resistance to the source of the first transistor in response to the gain control signal increasing a gain of the amplifier.

14. The amplifier of claim 1, wherein the first source degeneration circuit is configured to reduce a variation of a pole frequency of a frequency response of the amplifier in response to the gain control signal varying a gain of the amplifier.

15. The amplifier of claim 1, wherein the first source degeneration circuit is configured to apply more capacitance to the source of the first transistor in response to the gain control signal increasing a gain of the amplifier.

16. A method for signal amplification, comprising:
    amplifying an input signal via a first transistor of an amplifier;
    adjusting a gain associated with the amplification of the input signal via a gain control signal, wherein adjusting comprises sinking a current from the source of the first transistor based on the gain control signal; and
    selectively coupling a source degeneration circuit to a source of the first transistor based on the gain control signal to effectuate simultaneous adjustment of the gain with the coupling of the source degeneration circuit to the source of the first transistor.

17. The method of claim 16, wherein:
    the input signal comprises a differential input signal being amplified via the first transistor and a second transistor; and
    the source degeneration circuit is selectively coupled between the source of the first transistor and a source of the second transistor, based on the gain control signal.

18. The method of claim 17, wherein the adjusting of the gain comprises sinking another current from the source of the second transistor based on the gain control signal.

19. The method of claim 16, wherein the source degeneration circuit comprises:
    a resistive element; and
    a capacitive element coupled in parallel with the resistive element.

20. The method of claim 16, wherein:
    the source degeneration circuit comprises a plurality of parallel resistor-capacitor (RC) circuits; and
    the selectively coupling comprises selectively coupling each of the plurality of parallel RC circuits to the source of the first transistor based on the gain control signal, the gain control signal being a digital signal.

21. The method of claim 16, further comprising performing continuous-time linear equalization (CTLE) by setting an impedance coupled to a source of the first transistor.

22. The method of claim 16, wherein selectively coupling source degeneration circuit comprises providing a more uniform gain of the amplifier between a zero and a pole of a frequency response of the amplifier in response to the gain control signal.

23. The method of claim 16, wherein selectively coupling source degeneration circuit comprises applying more resistance to the source of the first transistor in response to the gain control signal increasing a gain of the amplifier.

24. The method of claim 16, wherein selectively coupling source degeneration circuit comprises reducing a variation of a pole frequency of a frequency response of the amplifier in response to the gain control signal varying a gain of the amplifier.

25. The method of claim 16, wherein selectively coupling source degeneration circuit comprises applying more capacitance to the source of the first transistor in response to the gain control signal increasing a gain of the amplifier.

26. An apparatus for signal amplification, comprising:
    means for amplifying an input signal;
    means for adjusting a gain associated with the means for amplifying of the input signal including adjusting a current source via a gain control signal; and
    means for selectively coupling a source degeneration circuit to the means for amplifying based on the gain control signal to effectuate simultaneous adjustment of the gain with the coupling of the source degeneration circuit to the means for amplifying.

27. The apparatus of claim 26, wherein the means for selectively coupling the source degeneration circuit comprises means for applying more resistance to the source of the first transistor in response to the gain control signal increasing a gain of the amplifier.

28. The apparatus of claim 26, wherein the means for selectively coupling the source degeneration circuit comprises means for applying more capacitance to the source of the first transistor in response to the gain control signal increasing a gain of the amplifier.

* * * * *